(12) United States Patent
Shu et al.

(10) Patent No.: US 8,338,207 B2
(45) Date of Patent: Dec. 25, 2012

(54) BULK SILICON MOVING MEMBER WITH DIMPLE

(75) Inventors: Chia-Pao Shu, Hsinchu (TW); Chia-Hua Chu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/006,239

(22) Filed: Jan. 13, 2011

(65) Prior Publication Data
US 2012/0181637 A1   Jul. 19, 2012

(51) Int. Cl.
*H01L 21/02*   (2006.01)
(52) U.S. Cl. .................. 438/50; 257/E21.002
(58) Field of Classification Search .............. 438/50; 257/E21.002
See application file for complete search history.

(56) References Cited

U.S. PATENT DOCUMENTS

| | | | |
|---|---|---|---|
| 6,486,425 B2 * | 11/2002 | Seki | 200/181 |
| 7,121,141 B2 | 10/2006 | McNeil | |
| 2006/0065942 A1 * | 3/2006 | Chou et al. | 257/415 |
| 2006/0278942 A1 * | 12/2006 | Rubel | 257/415 |
| 2010/0072043 A1 * | 3/2010 | Bar et al. | 200/181 |

OTHER PUBLICATIONS

U.S. Appl. No. 12/900,718, filed Oct. 8, 2010, entitled "Package Systems and Manufacturing Methods Thereof," 13 pages of text, 6 pages of drawings.

* cited by examiner

*Primary Examiner* — Alexander Ghyka
*Assistant Examiner* — Stanetta Isaac
(74) *Attorney, Agent, or Firm* — Haynes and Boone, LLP (57) ABSTRACT

A method for forming a semiconductor device includes forming a substrate, forming a moveable member of bulk silicon and forming a first dimple structure on a first surface of the moveable member, where the first surface faces the substrate.

15 Claims, 14 Drawing Sheets

BULK SILICON MOVING MEMBER WITH DIMPLE

BACKGROUND

The present disclosure relates generally to semiconductor manufacturing. Specifically, the present disclosure relates to devices with bulk silicon moving members that have dimples and methods of making the same.

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Micro-electro-mechanical systems (MEMS) devices include very small electro-mechanical systems incorporated into semiconductor IC circuits. Some MEMS devices have moving members separated from the substrate by a gap and one or more bumps. The bumps are on top of the substrate and may be in contact with a sensing electrode. As a moving member moves toward the substrate, its movement is constrained by the bumps, and a sensing electrode senses the movement. When some materials, such as oxides, are used for bumps the resulting device may experience parasitic capacitance and stiction at the interface between the bumps and the moving member. Parasitic capacitance and stiction may make the resultant device ineffective in sensing some movement.

Similarly, using metal for bumps may require an additional metal routing step, thereby making the resultant device incrementally more expensive to manufacture. Therefore, what is needed is an improved MEMS device and method for making the same.

SUMMARY

The present disclosure provides for many different embodiments. In one embodiment, a method for forming a micro-electro-mechanical system (MEMS) device is disclosed. The method includes forming a substrate, forming a moveable member of bulk silicon, and forming a first dimple structure on a first surface of the moveable member, where the first surface faces the substrate.

In another embodiment, a method for forming a semiconductor device includes forming a substrate, forming an oxide layer over the substrate, and forming a bulk silicon layer over the oxide layer. The method further includes fusion bonding the bulk silicon layer and the oxide layer by annealing, forming a moveable member from the bulk silicon layer, and forming a first dimple structure on a first surface of the moveable member. The first dimple structure acts as a stopper between the moveable member and the substrate.

In another embodiment, a method for forming a semiconductor device includes forming a substrate; forming an insulator layer over the substrate; and forming a bulk silicon layer over the insulator layer. The bulk silicon layer is patterned and a portion of the insulator layer is removed to form a moveable member of bulk silicon. A first dimple structure is formed on a first surface of the moveable member, where the first surface faces the substrate.

The present disclosure also describes a semiconductor device. In one embodiment, the device comprises a substrate and an insulator layer over the substrate. The insulator layer includes two portions surrounding a cavity, at least one of the portions including a signaling component. The device further includes a bulk silicon layer over the insulator layer, the bulk silicon layer including three portions. Two of the three portions of the bulk silicon layer are over the two portions of the insulator layer, and one of the two portions of the bulk silicon layer includes a signaling component to engage with the signaling component in the insulator layer. The third portion of the bulk silicon layer is separate from the other two and is over the cavity.

In another embodiment, a semiconductor device includes a substrate and a moving member with a first dimple structure thereon between the substrate and a first surface of the moving member. The moving member includes bulk silicon.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor manufacturing. Specifically, the present disclosure relates to devices with bulk silicon moving members that have dimples and methods of making the same.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer. The present disclosure refers to MEMS devices; however, one of ordinary skill in the art will find other applicable technologies that may benefit from the disclosure, such as nanoelectromechanical systems (NEMS) devices. Furthermore, the MEMS device structure or design illustrated is exemplary only and not intended to be limiting in any manner.

Figure 1:
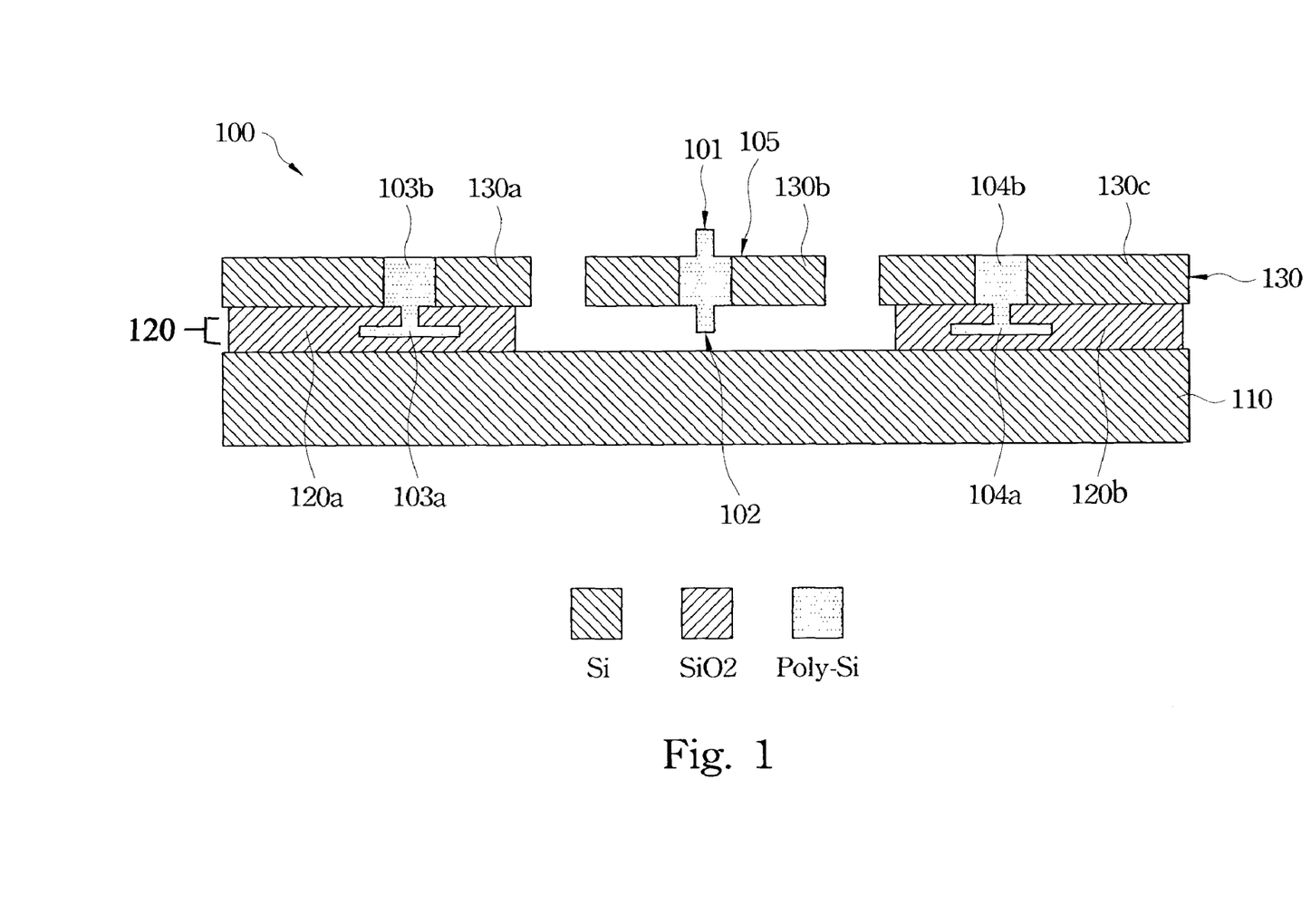
FIG. 1 is a cross-sectional illustration of an exemplary MEMS device according to one embodiment.
Figure 2:
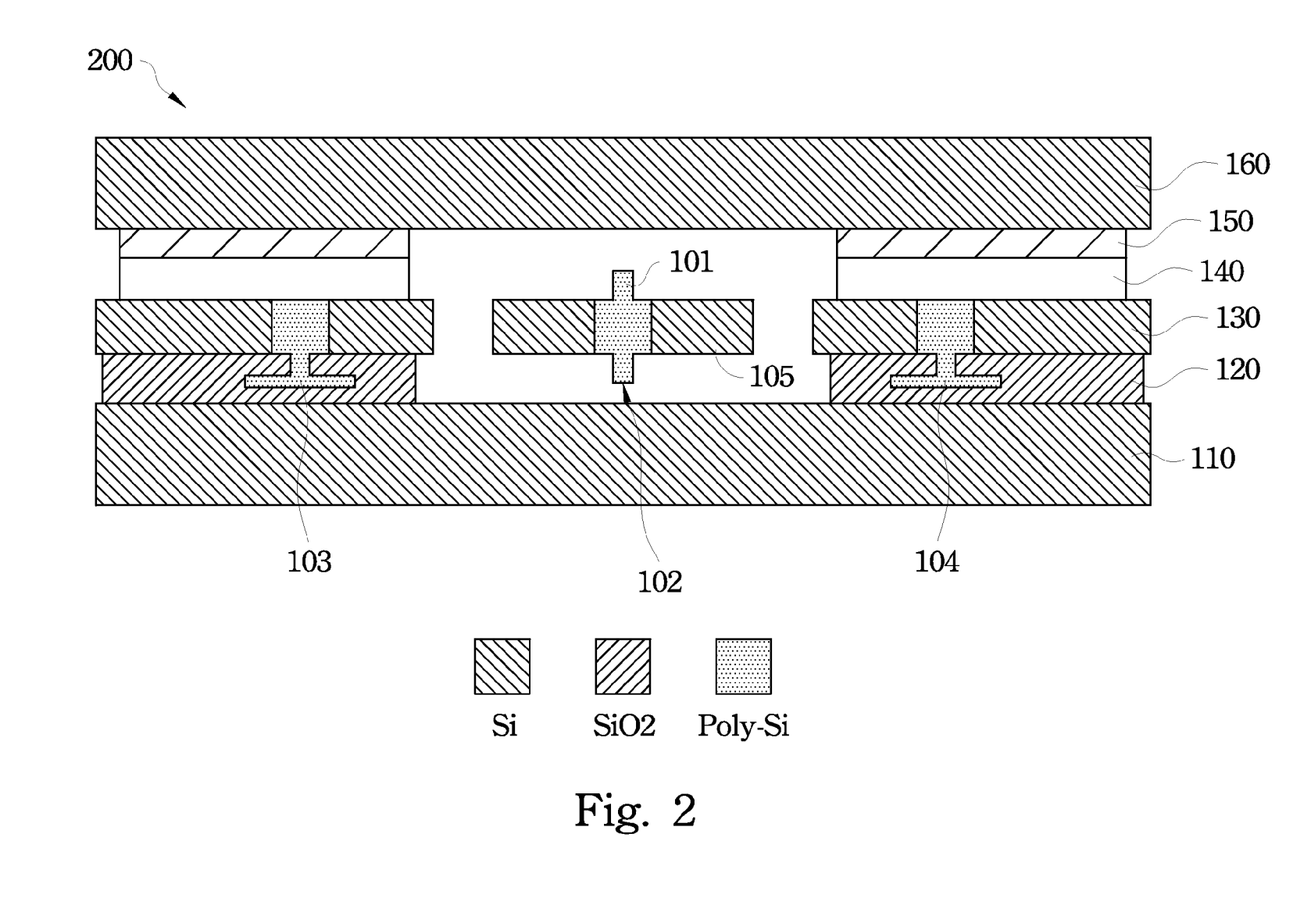
FIG. 2 is a cross-sectional illustration of an exemplary MEMS device according to one embodiment.

FIGS. 1 and 2 are illustrations of exemplary MEMS devices 100 and 200, respectively. MEMS devices 100 and 200 can be used in any of a variety of MEMS-based applications, such as accelerometers and other motion-detecting sensors.

Referring to FIG. 1, MEMS device 100 includes substrate 110, silicon dioxide (SiO2) layer 120, and bulk silicon layer 130. The substrate 110 can be made of bulk silicon, and may include various additional components, such as active regions or other conducting elements. The SiO2 layer 120 includes two portions 120a and 120b surrounding a cavity area. The portions 120a and 120b also include signal routing elements, such as elements 103a and 104a, respectively. The bulk silicon layer 130 includes three portions: 130a, 130b, and 130c. Portions 130a and 130c are directly adjacent to the SiO2 portions 120a and 120b, respectively, and also include routing elements 103b and 104b that are adjacent and electrically connected to routing elements 103a and 104a, respectively. Routing elements 103a, 103b, 104a, and 104b in the present embodiment are made of polysilicon. It is noted that both bulk silicon and poly-silicon are compatible with an annealing step that can employ temperatures up to (and higher than) nine hundred degrees centigrade. Thus, in some embodiments, an annealing step can be used to form a fusion bond between SiO2 layer 120 and bulk silicon layer 130.

The middle portion of the bulk silicon layer 130b is used to form a moveable member 105. The moveable member 105 also includes an interposed poly-silicon portion that provides one or more dimple structures, such as structures 101 and 102. In this embodiment, dimple structures 101, 102 constrain the range of motion of moveable member 105 during operation. Of note in FIGS. 1 and 2 is that dimple structures 101, 102 are formed on moveable member 105, rather than on a non-moving structure (e.g., substrate 110). Furthermore, since moveable member 105 is made of bulk silicon, it integrates well with the poly-silicon of dimple structures 101, 102 and signal routing structures 103, 104. Additional components and circuitry may be included above, below, and around the device 100, such as is disclosed in FIG. 2 discussed below.

Referring now to FIG. 2, the MEMS device 200 is similar to the MEMS device 100, except that it includes an upper structure. The upper structure of device 200 includes utility bond material 140 (e.g., Ge or AlCu), metal layer 150, and another bulk silicon layer 160. Moveable member 105 can thereby move between substrate 110 and silicon layer 160, its motion constrained on the top and bottom by dimple structures 101, 102, respectively. Sensing elements in one or both of the substrate 110 and silicon layer 160 can be included to be responsive to any movement in the member 105, as is well known in the art.

Figure 3A:
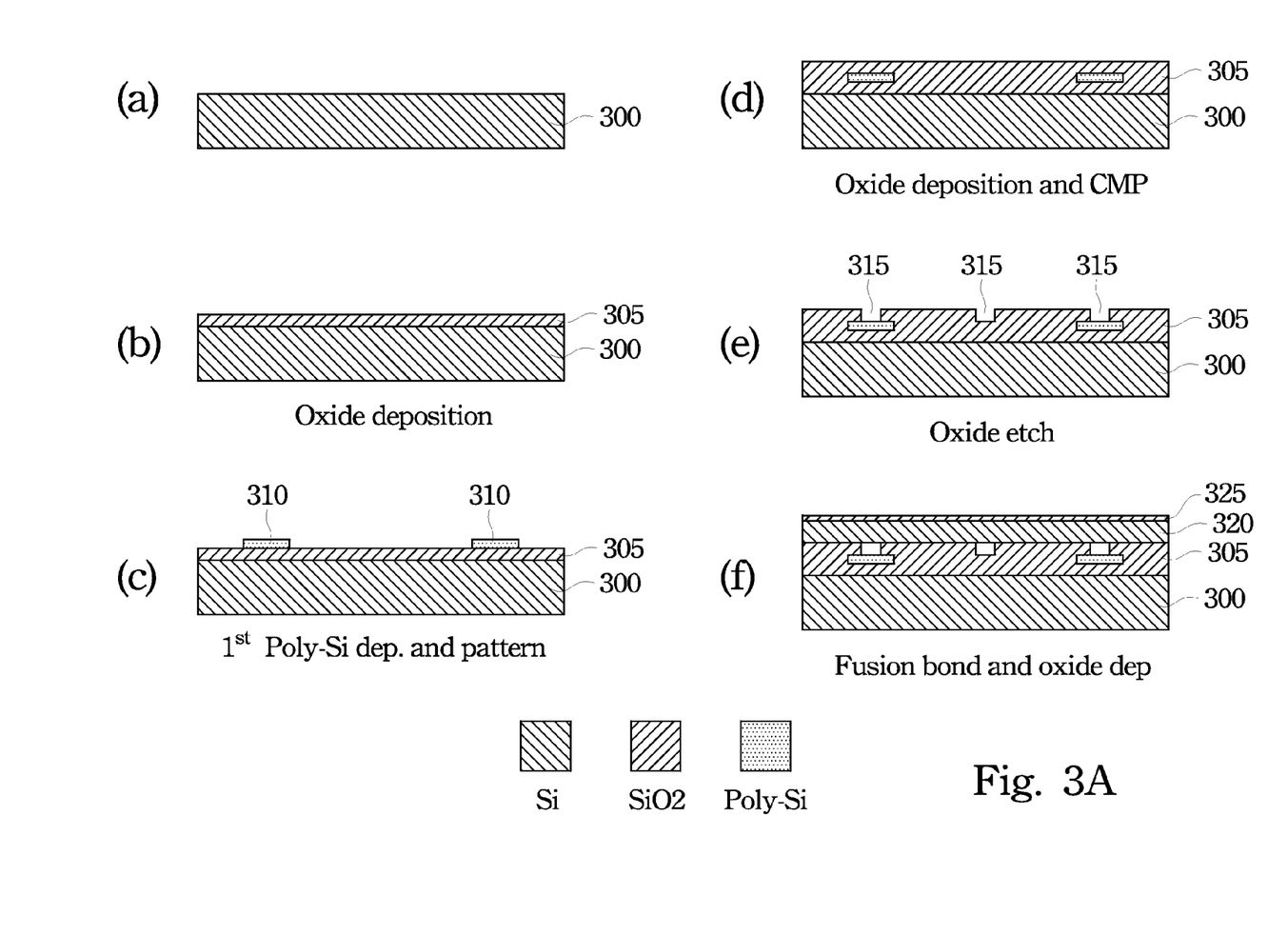
FIGS. 3A and B provide an illustration of an exemplary process using cross-sectional views of a MEMS device during various manufacturing steps, adapted according to one embodiment.
Figure 3B:
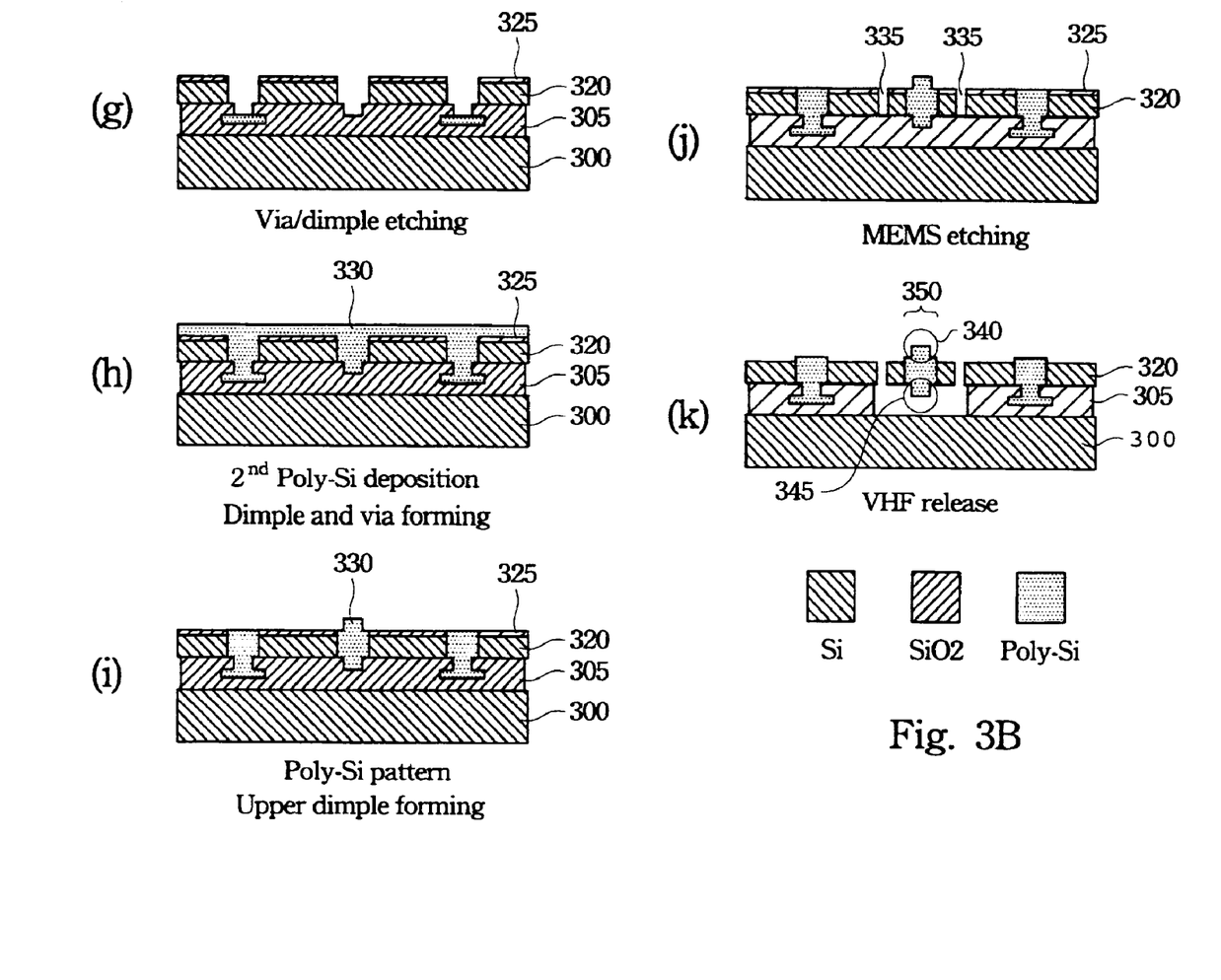

FIGS. 3A and 3B illustrate steps in an exemplary process for manufacturing structures shown in FIGS. 1 and 2. In FIG. 3, step (a) includes forming substrate 300. In the embodiment shown in FIG. 3, substrate 300 is a bulk silicon (Si) substrate. In alternative embodiments, substrate 300 may include poly-silicon or even other elementary semiconductors such as germanium, or may include a compound semiconductor such as, silicon carbide, gallium arsenide, indium arsenide, and indium phosphide.

Step (b) includes an oxide deposition process that forms oxide layer 305. One example embodiment includes Chemical Vapor Deposition (CVD) of SiO$_2$, though other deposition processes can be used as well. Also, it is contemplated that other types of dielectric layers may be used. Oxide layers (such as layer 305) may be formed on the substrate 300 by bonding, depositing, growing and thermally oxidizing, CVD, or other methods known in the art for forming dielectric layers on a substrate.

In step (c), poly-silicon 310 is deposited on oxide layer 305 and then patterned to form the shapes shown. A photo-resist is not shown in FIG. 3, though it is understood that a photo-resist can be used to create the pattern by allowing other parts of the poly-silicon 310 to be removed by a photolithographic process.

In step (d), more oxide is deposited on oxide layer 305. Then a Chemical Mechanical Planarization (CMP) process is used to make the top surface of layer 305 smooth and level. In step (e), the oxide is etched by, e.g., a photolithographic process, to create features 315 and partly expose poly-silicon 310.

In step (f), bulk silicon layer 320 is formed. Bulk silicon layer 320 may be formed by bonding (e.g., by chemical vapor deposition (CVD)), by growing the layer 320 or by other methods now known or later developed. An annealing process is also performed to create a fusion bond between bulk silicon layer 320 and oxide layer 305. Annealing may include temperatures in excess of nine hundred degrees centigrade, though a specific temperature chosen for a specific embodiment may differ as appropriate. The annealing process creates a full-blanket fusion, which is typically very strong. A CVD process is then performed to create oxide layer 325, which is a stop layer that can be used to control the device thickness.

In step (g), etching is performed on oxide layer 325 and bulk silicon layer 320. The etching may include, e.g., a photolithographic process. In step (h), layer 330 of poly-silicon is deposited using CVD. In step (i), poly-silicon layer 330 is patterned to form the shape of upper dimple structure 101 (FIG. 1). Lower dimple structure 102 (FIG. 1) can also be seen in the poly-silicon.

In step (j), layers 325 and 320 are etched to form structures 335. Once again, the etching in this example includes photolithography, though other embodiments may employ other etching techniques. In step (k), an isotropic vapor HF release is used to etch away oxide layers 305 and 325, thereby creating the structure shown in FIG. 1.

Figure 4A:
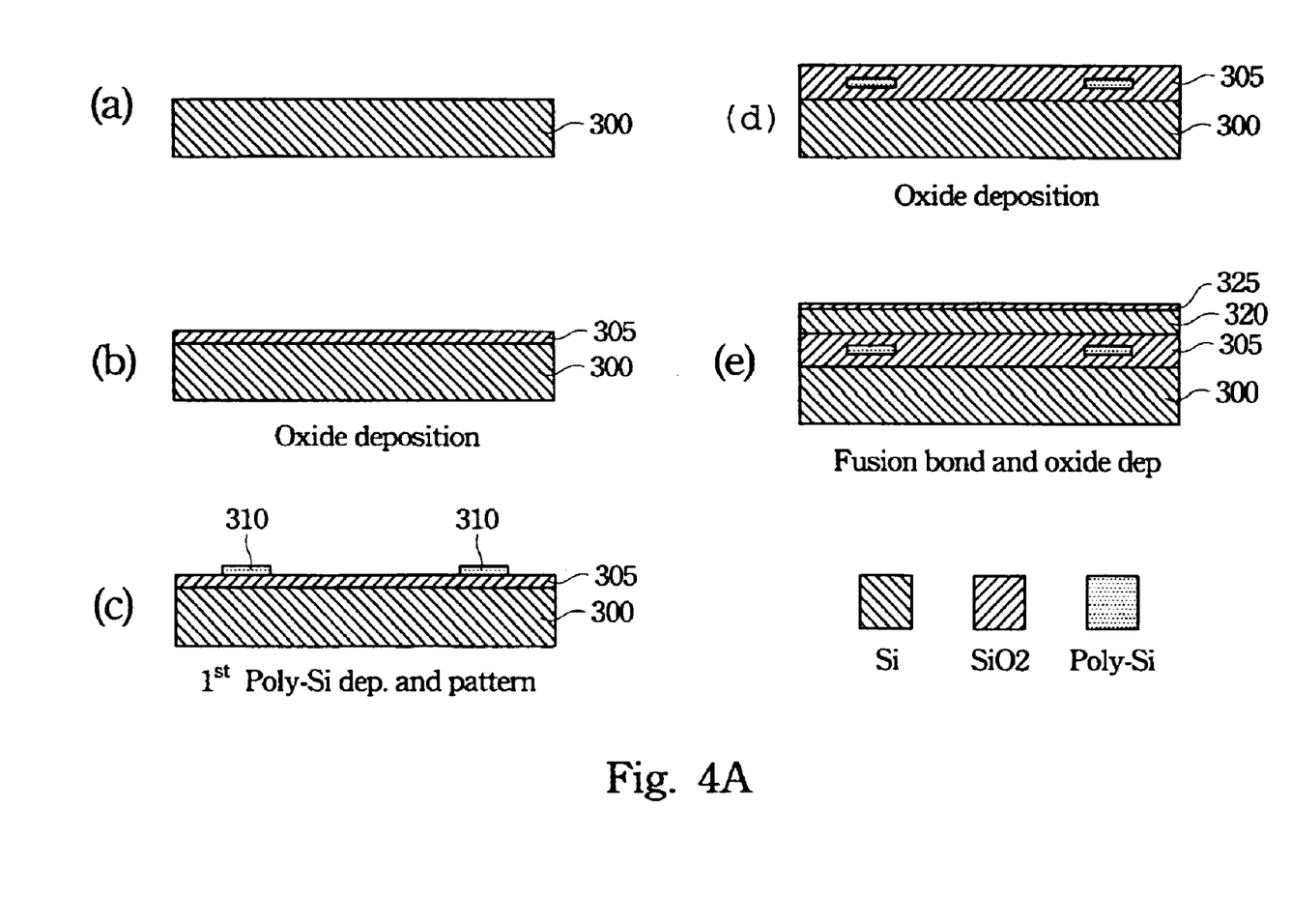
FIGS. 4A and B provide an illustration of an exemplary process using cross-sectional views of a MEMS device during various manufacturing steps, adapted according to one embodiment.
Figure 4B:
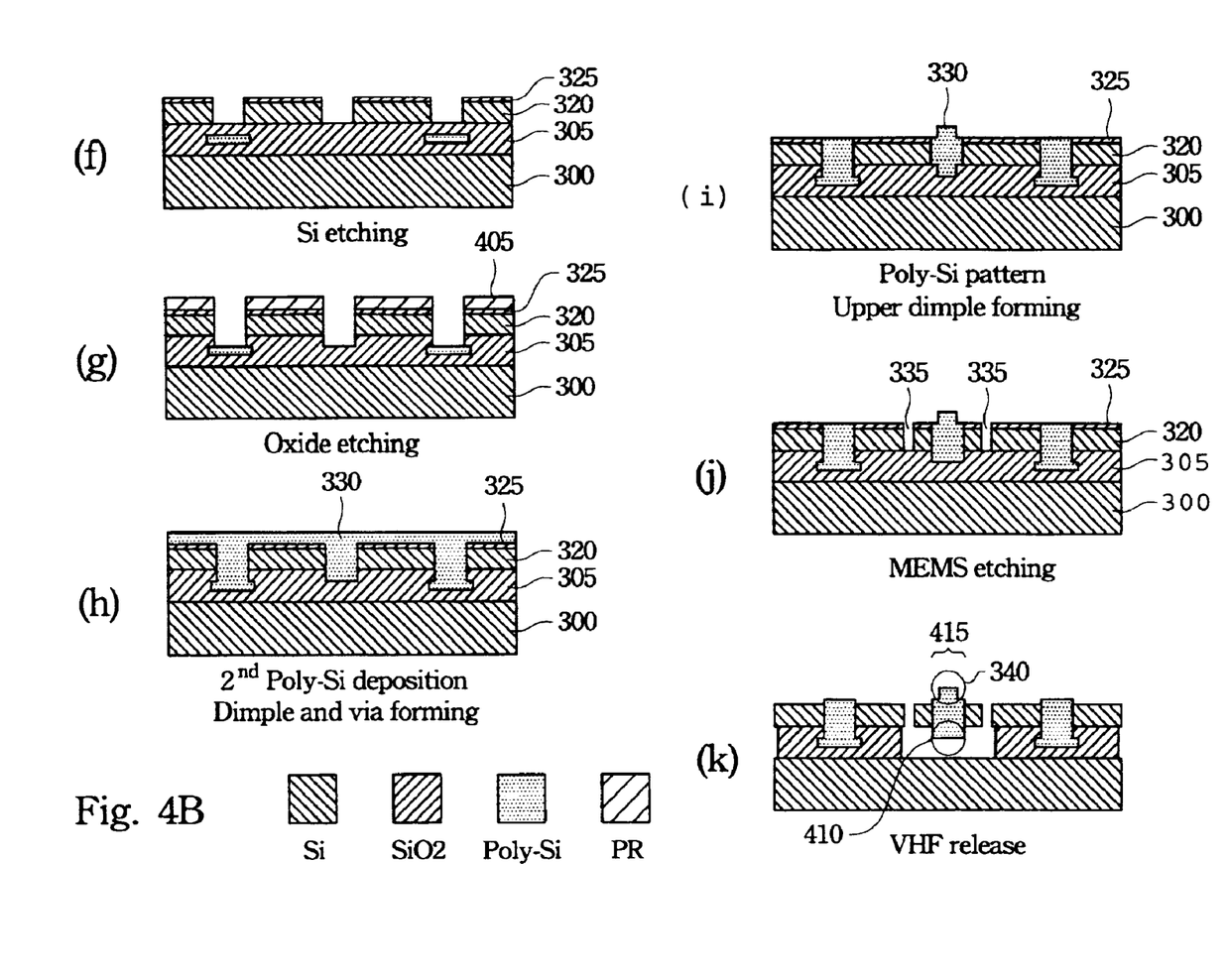

Structures 340 and 345 correspond to upper and lower dimple structures 101, 102 in FIG. 1. Structures 340 and 345 are both narrower than a width of the interposed poly-silicon structure 350. The forming steps that produce structures 340, 345 each use a mask to achieve the narrow, dimple shapes shown in FIG. 3B. As shown in FIGS. 4A-4B, a different embodiment eliminates one of the patterning steps, though one of the dimples may not be as finely formed.

FIGS. 4A and 4B illustrate steps in an exemplary process for manufacturing structures according to one embodiment. In FIG. 4A, steps (a)-(d) are the same as in FIG. 3A. The process of FIG. 4A then diverges from the process of FIG. 3A by skipping the first oxide etch (i.e., step (e) in FIG. 3A), instead depositing bulk silicon layer 320 over oxide layer 305. Then an annealing process is performed to create a fusion bond between oxide layer 305 and bulk silicon layer 320. Oxide layer 325 is then deposited.

Moving to FIG. 4B, in step (f), an etch is performed to remove portions of bulk silicon layer 320 and oxide layer 325. In this example, the etch includes a photolithographic process. In step (g), Oxide layer 305 is etched. Note that mask 405 is applied over oxide layer 325 so that only oxide layer 305 is subject to etching.

In step (h), the second poly-silicon deposition forms poly-silicon layer 330, and in step (i), poly-silicon layer 330 is patterned to form the shape of upper dimple structure 101 (FIG. 1), using photolithography in this example. In step (j), structures 335 are formed by etching bulk silicon layer 320 and oxide layer 325. Then, a vapor HF process is performed in step (k) to form moveable member 415 by releasing moveable member 415 from oxide layer 305.

Of note in FIG. 4B is that bottom dimple structure 410 has a different aspect ratio than does upper dimple structure 340. Thus, the process shown in FIGS. 4A, B has less precision than the process shown in FIGS. 3A, B. However, many applications do not need a narrower or more finely crafted bottom dimple structure. Also, the process shown in FIGS. 4A and B has the advantage of omitting a patterning process, thereby decreasing complexity and cost relative to the process shown in FIGS. 3A, B.

Various embodiments may differ somewhat from those shown in FIGS. 3A, B and 4A, B. For instance, specific etching processes and shapes may differ in some embodiments. Furthermore, some embodiments include processes to add structures 140, 150, 160 from FIG. 2 over the structures produced by the processes of FIGS. 3A, B and 4A, B. For instance, metal layer 150 may be formed from tungsten, aluminum, copper, nickel or any other metal. Metal layer 150 may be formed using patterning, masking, deposition (e.g., physical vapor deposition) and/or any other methods now known or known in the future for forming metal in a semiconductor device. Layer 160 may be formed in a manner similar to that used to form bulk silicon layer 320.

Figure 5:
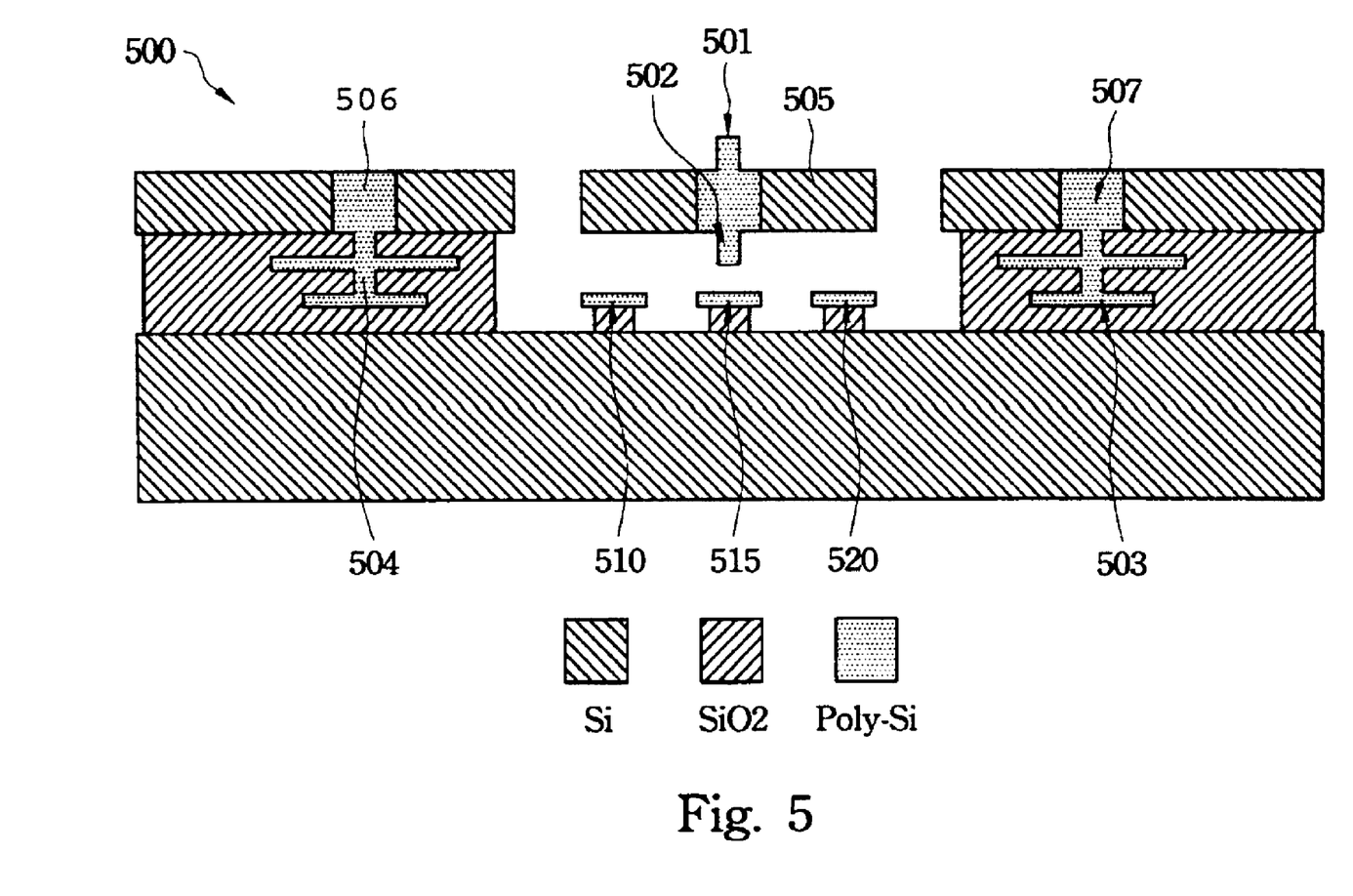
FIG. 5 is a cross-sectional illustration of an exemplary MEMS device according to one embodiment.

The exemplary processes of FIGS. 3A, B and 4A, B produce a structure that has a single routing layer, as shown by signal routing structures 103, 104 of FIG. 1. Various embodiments may include any number of signal routing layers appropriate for a given application. FIG. 5 shows an embodiment with two routing layers. FIGS. 6A-C and 7 A-C show exemplary processes for creating a structure with two routing layers, and it is understood that the processes shown herein may be modified to create three or more routing layers if desired.

FIG. 5 is an illustration of exemplary MEMS device 500 adapted according to another embodiment of the present invention. Device 500 includes many components and elements similar to those of FIGS. 1 and 2, as well as electrodes, discussed further below. Device 500 includes moveable member 505, which has dimple structures 501, 502 on its bottom and top surfaces, respectively. Moveable member 505 moves up and down, relative to sensing electrodes 510, 520 that sense the movement. Stopper electrode 515, along with dimple structure 502, act to constrain the downward range of motion of moveable member 505. Dimple structure 501 constrains the upward range of motion of moveable member 505 when used with an upper structure (not shown).

As in the other embodiments illustrated herein, moveable member 505 is formed of bulk silicon and has an interposed structure of poly-silicon that forms dimple structures 501, 502. Poly-silicon is used for signal routing in these examples. Specifically, vias 506 and 507 allow electrical communication with two-layer signal routing structures 504, 503. As with the device of FIG. 1, some embodiments may add an upper structure with a utility bond, a metal layer, and another bulk silicon layer, though such embodiment is not illustrated in FIG. 5.

Figure 6A:
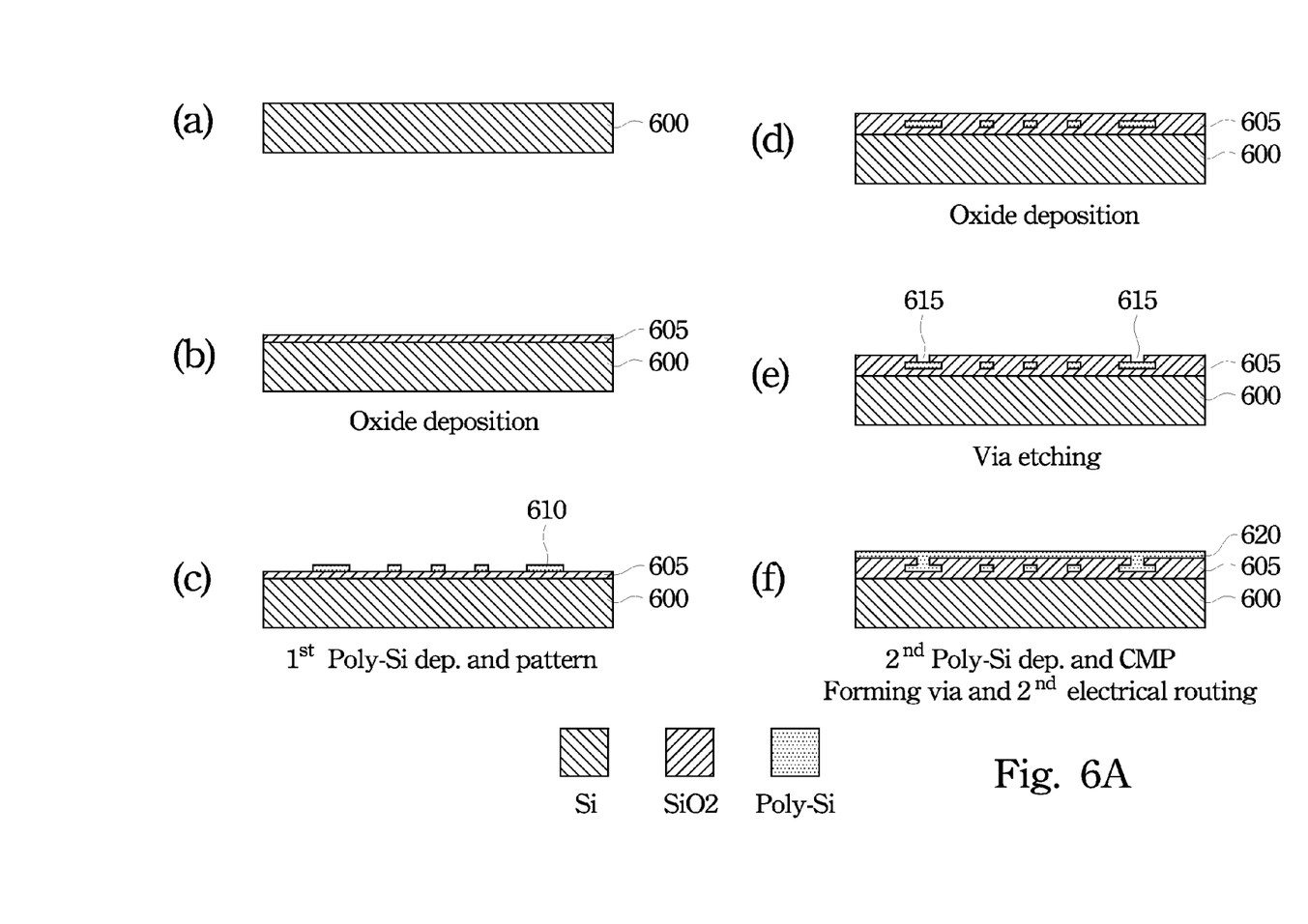
FIGS. 6A-C provide an illustration of an exemplary process using cross-sectional views of a MEMS device during various manufacturing steps, adapted according to one embodiment.
Figure 6B:
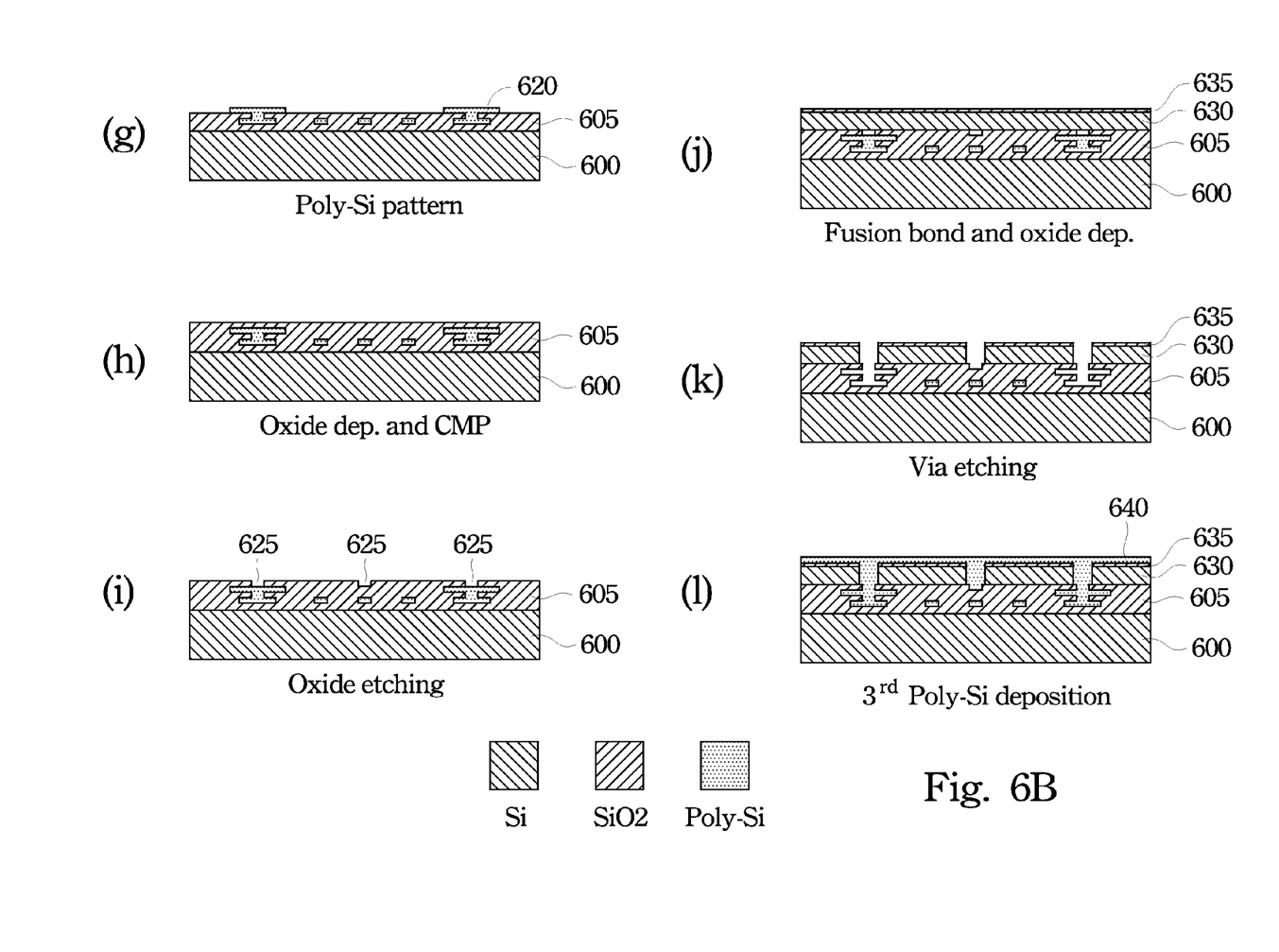
Figure 6C:
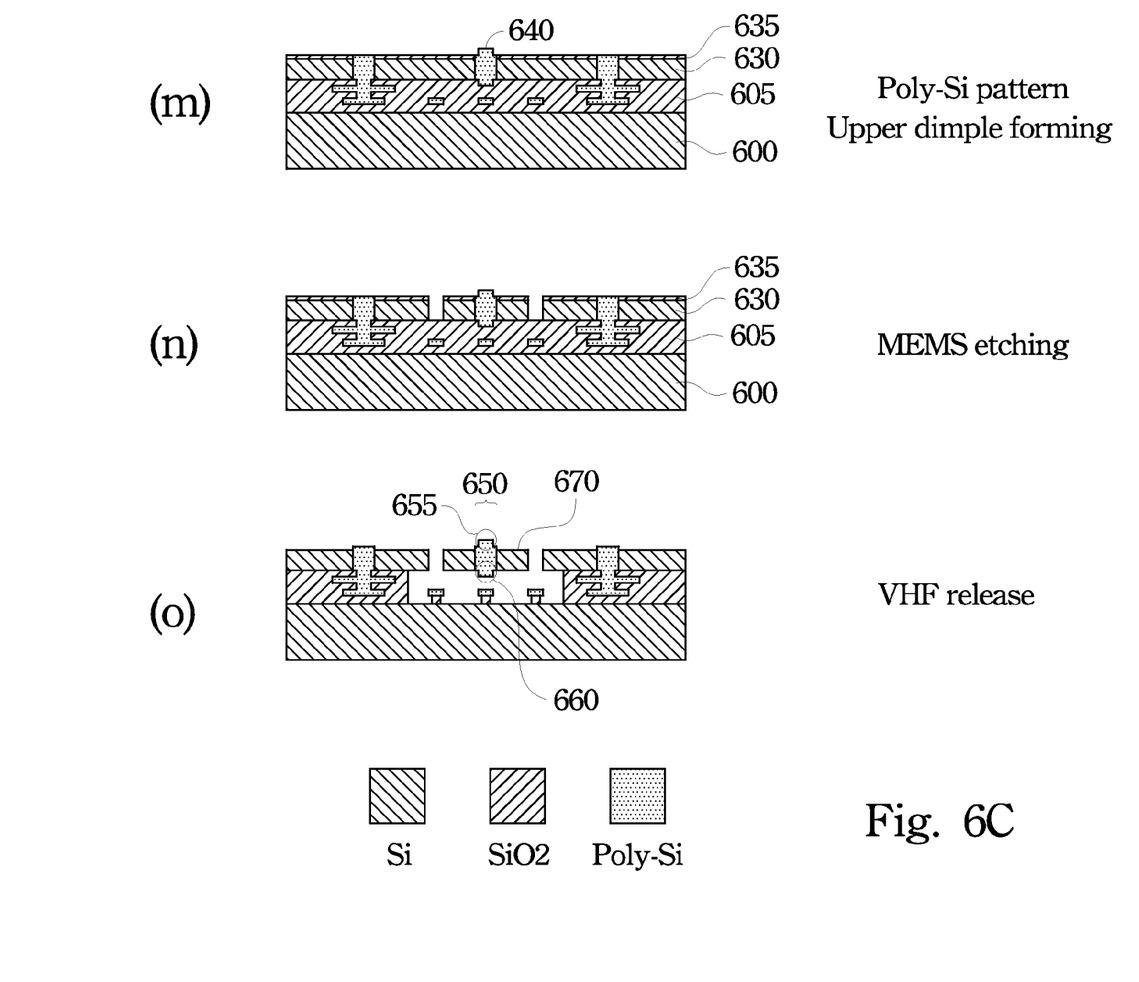
Figure 7A:
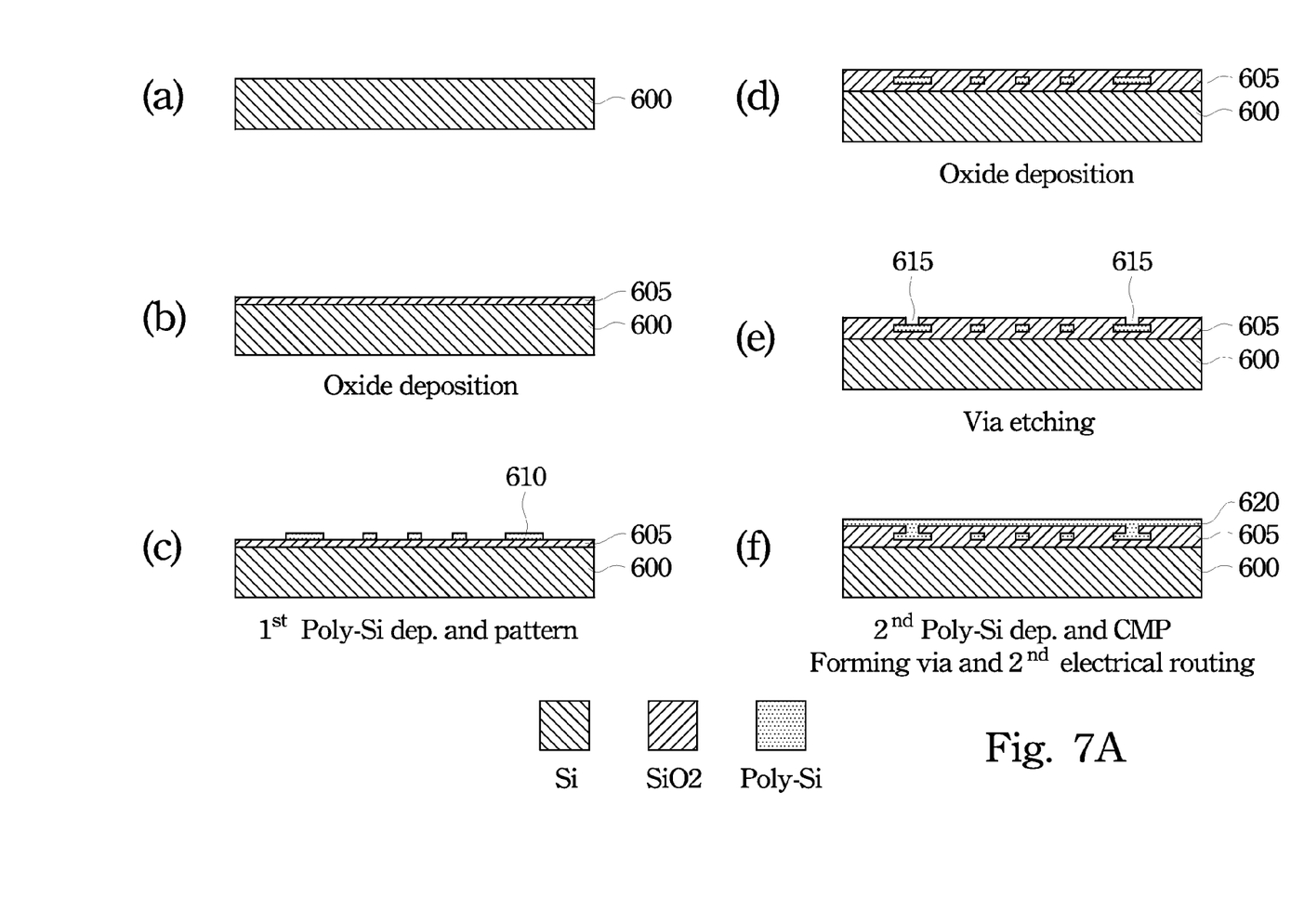
FIGS. 7A-C provide an illustration of an exemplary process using cross-sectional views of a MEMS device during various manufacturing steps, adapted according to one embodiment.
Figure 7B:
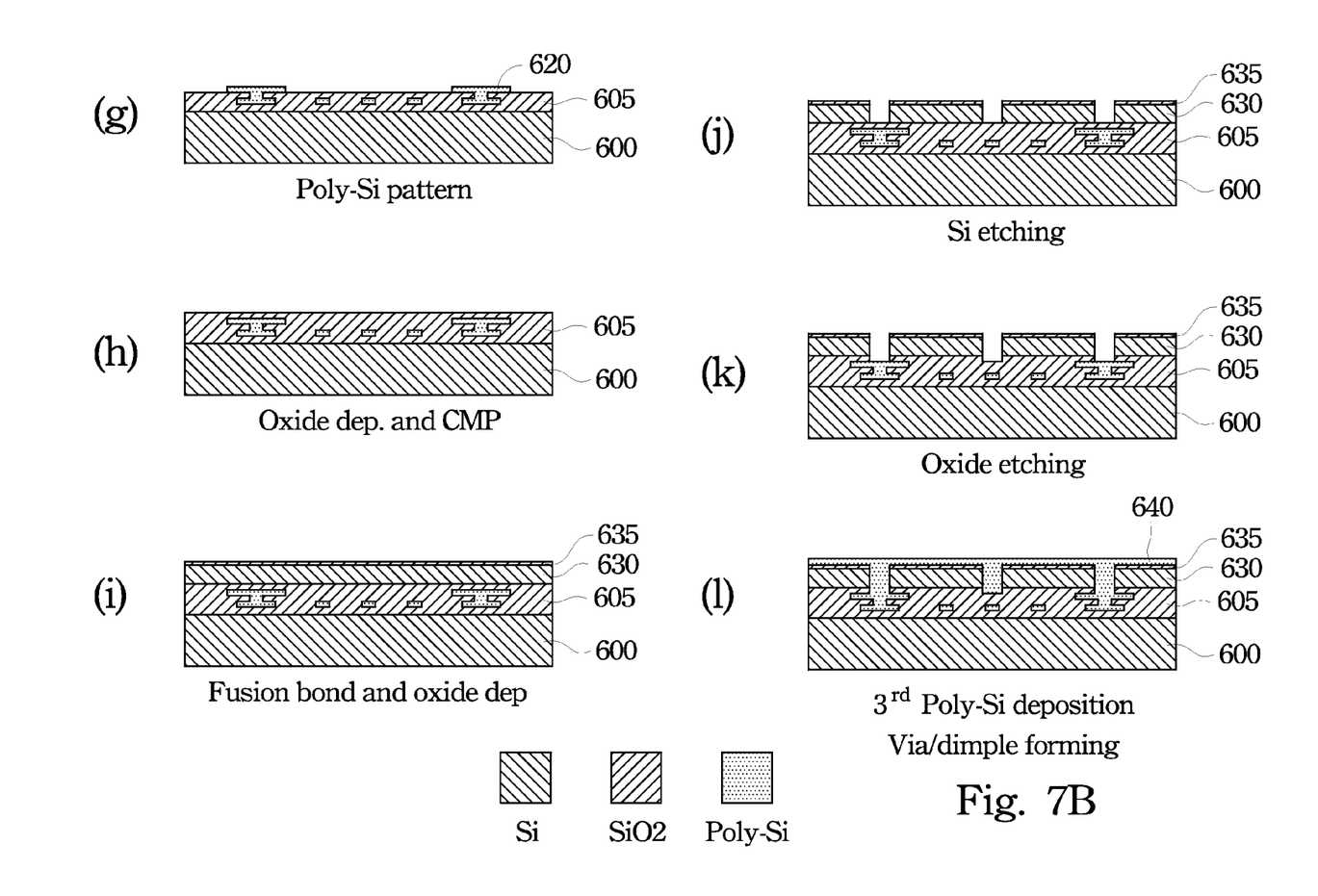
Figure 7C:
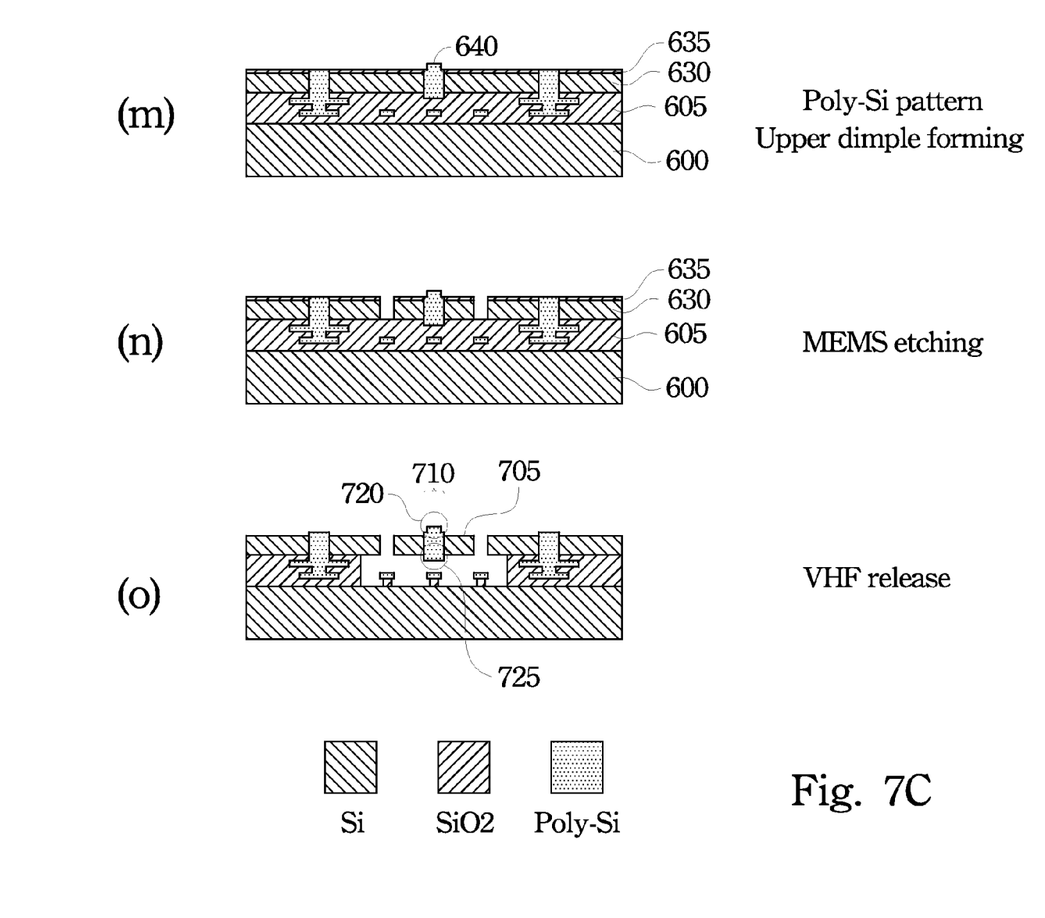

FIGS. 6A-C and 7A-C illustrate exemplary processes to manufacture devices the same as or similar to device 500 of FIG. 5. FIGS. 6A-C show a process to manufacture a device that has dimple structures that are narrower than the interposed poly-silicon structure from which they are formed. FIGS. 7A-C show a process to manufacture a device that has a bottom dimple structure having the same width as the interposed poly-silicon structure from which it is formed. It is understood that the same types of deposition and etching processes applied in FIGS. 3A, B and 4A, B may applied in the processes of FIGS. 6A-C and 7A-C.

Moving to FIG. 6A, steps (a)-(e) are similar to the steps (a)-(e) of FIG. 3A. Specifically, in FIG. 6A, substrate 600 is formed, and oxide layer 605 is deposited thereon. Poly-silicon layer 610 is then formed and patterned, as shown in step (c). More oxide is deposited, making oxide layer 605 thicker, and then structures 615 are etched in oxide layer 605. Second poly-silicon layer 620 is deposited in step (f) and subjected to CMP to form an electrical routing layer.

In step (g), poly-silicon layer 620 is patterned to create another signal routing structure. More oxide is deposited on layer 605, thereby overlaying poly-silicon layer 620 in step (h). In step (i), oxide layer 605 is etched to form structures 625, and at (j), bulk silicon layer 630 is formed. An annealing process is then performed to create a fusion bond between oxide layer 605 and bulk silicon layer 630. Oxide layer 635 is then formed.

In step (k), more via etching is performed. In step (l), third poly-silicon layer 640 is formed and creates a via structure that provides electrical communication with the underlying signal routing layers. Poly-silicon layer 640 is patterned at (m) to create an upper dimple structure. Etching is then performed at (n) to remove parts of layers 630 and 635. In step (o), a vapor HF etch is performed to release moveable member 670 from oxide layer 605.

Moveable member 670 is made of bulk silicon from layer 630 and has interposed poly-silicon structure 650 that forms upper dimple structure 655 and lower dimple structure 660. Both dimple structures 655, 660 are narrower than the width of interposed poly-silicon structure 650. The structure shown in step (o) of FIG. 6C is substantially the same as that shown in FIG. 5. By contrast, the bottom dimple structure formed by the process of FIGS. 7A-C is less precisely formed and uses one fewer patterning process than that shown in FIG. 6C.

Moving to FIGS. 7A-C, steps (a)-(h) are the same as in FIGS. 6A-C. Moving to step (i), the process of FIGS. 7A-C omits the oxide etching step at (i) of FIG. 6B and instead forms bulk silicon layer 630 over oxide layer 605. Annealing is then performed to create a fusion bond, and oxide layer 635 is deposited over layer 630.

In steps (j) and (k), bulk silicon layer 630 and oxide layer 605 are etched to form vias to the signal routing structures. In step (l), third poly-silicon layer 640 is formed and fills the vias. Steps (m)-(o) are the same in FIG. 7C as in FIG. 6C. The process at (o) forms moveable member 705, which includes interposed poly-silicon structure 710 having upper and lower dimple structures 720, 725. As in FIG. 4B, lower dimple structure 725 is the same width as interposed poly-silicon structure 710 and not as finely shaped as upper dimple structure 720. However, some applications operate satisfactorily with lower dimple structure 720 and benefit from the reduced cost from omission of a patterning step.

Further steps not shown herein include forming layers 140, 150, 160 (FIG. 2) overlaying the structure shown in step (o) of FIGS. 7C and 6C. Also, the embodiments shown in FIGS. 1-7C illustrate devices with single moveable members, but it is understood that devices within the scope of embodiments may include multiple moveable members. The various embodiments shown in FIGS. 1-7C can be used in any of a variety of devices. For instance, MEMS device with moveable members are especially useful in motion sensors, such as accelerometers, gyroscopes, and the like. Such applications may include the MEMS device as a stand-alone chip or on a same chip as another semiconductor device, such as a processor. The semiconductor devices, including the MEMS devices, may be packaged and installed in industrial and consumer applications. Examples of applications that may benefit from MEMS devices described herein include, e.g., gaming motion controllers, automotive sensors, etc.

Figure 8:
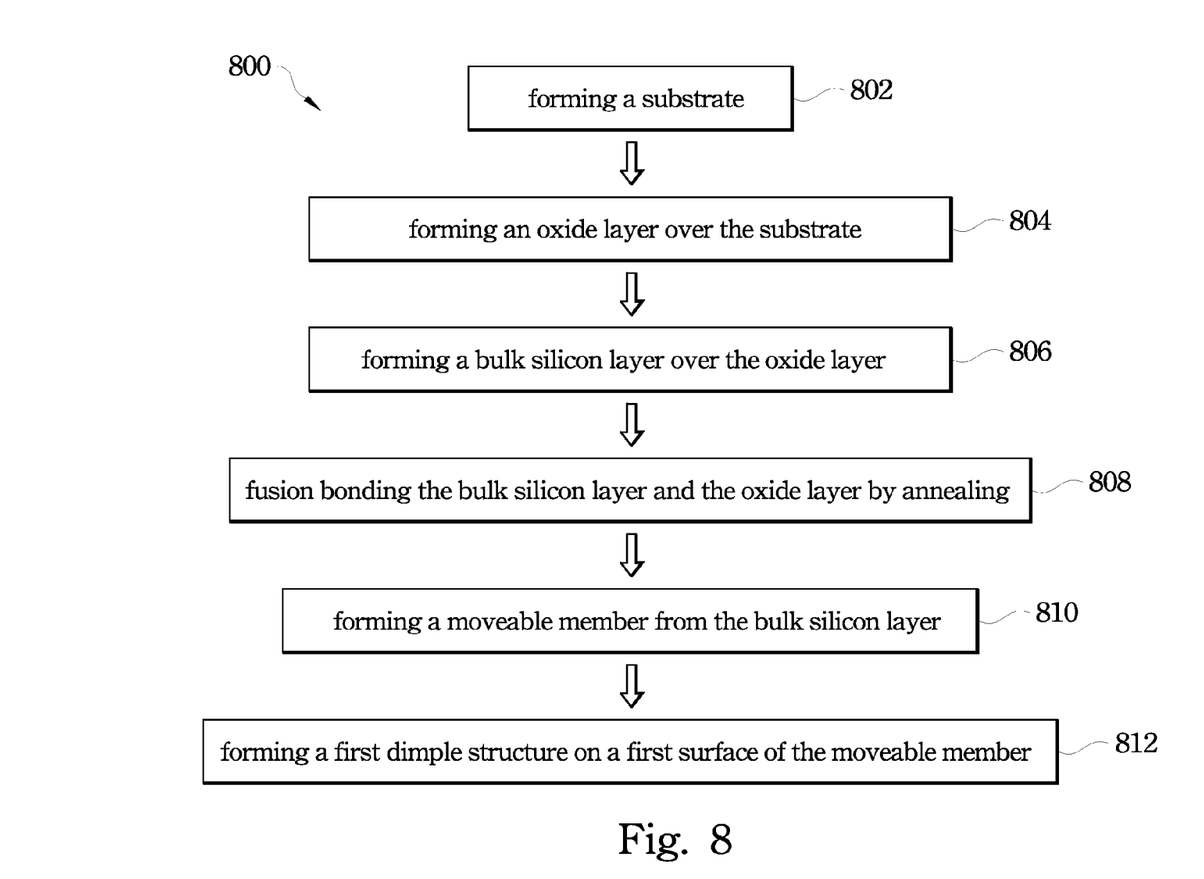
FIG. 8 is an illustration of an exemplary method for manufacturing a MEMS device, adapted according to one embodiment.

FIG. 8 provides a flow chart illustrating an embodiment of a method 800 for manufacturing MEMS devices. As described above in the cross sectional views of FIGS. 3A-7C, the MEMS devices may be formed using processes now known or later developed, such as CMOS fabrication processes, for example, photolithography, etching processes (e.g., wet etch, dry etch, plasma etch), deposition processes, plating processes, and/or other suitable processes.

FIGS. 1-7C illustrate views of embodiments of MEMS devices according to the method of FIG. 8. One of ordinary skill in the art recognizes additional steps that may be included in the method 800 and/or omitted from the method 800. For example, the structure of the MEMS devices depicted in FIGS. 1-7C are exemplary only, and similar methods may be used to form any similar device. Furthermore, other structure such as CMOS circuitry may be included in the devices depicted in FIGS. 1-7C.

The method 800 begins at block 802 where a substrate (e.g., a semiconductor wafer) is formed. The method 800 continues to block 804 where an oxide layer is formed on the substrate.

In block 806, a bulk silicon layer is formed over the oxide layer. Before block 806, the oxide layer may or may not be patterned to form a recess to shape a lower dimple structure. For example, FIGS. 3A and 6A show an oxide layer patterned to form such a recess, whereas the processes of FIGS. 4A-4B and 7A-7C omit such patterning step.

In block 808, annealing is performed to create a fusion bond between the bulk silicon layer and the oxide layer. An advantage of some embodiments is that routing is provided by poly-silicon rather than metal, thereby making the annealing step possible. Generally, other embodiments that use metal for routing are not compatible with high-temperature annealing. In this example, the annealing step creates a full-blanket fusion bond that is quite strong.

In block 810, a moveable member is formed from the bulk silicon layer. In some embodiments, the moveable member also includes an interposed poly-silicon structure that has the dimple structures thereon. In block 812, a first dimple structure is formed on a first surface of a moveable member. A second dimple structure is also formed on a second surface of the moveable member. As explained in detail above, the dimple structures can be more defined using an extra patterning step, or can be left with the same width dimension of the interposed poly-silicon structure by omitting such patterning step.

Method 800 is exemplary, and it is understood that other embodiments may include methods that add, omit, rearrange, or modify some actions. For instance, some embodiments may add an upper structure that encloses the moveable member, such as the upper structure shown in FIG. 2.

Various embodiments may include advantages over other techniques. For instance, as explained above, use of polysilicon for dimples and signal routing, rather than metal, allows for some processes to use high-temperature annealing. Additionally, the use of poly-silicon dimples, as opposed to metal stoppers, may reduce cost by omitting relatively expensive metal routing steps. Moreover, the use of poly-silicon for dimple structures may reduce stiction and parasitic capacitance compared to embodiments that use oxide stopper structures.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for forming a semiconductor device, the method comprising:
    forming a substrate;
    forming an insulator layer over the substrate;
    forming a bulk silicon layer over the insulator layer;
    patterning the bulk silicon layer and removing a portion of the insulator layer to form a moveable member of bulk silicon;
    forming a first dimple structure on a first surface of the moveable member, where the first surface faces the substrate; and
    forming a signaling component in the insulator layer and the bulk silicon layer, the signaling component comprising polysilicon; and
    wherein the first dimple structure comprises polysilicon, further wherein forming the first dimple structure includes forming a second polysilicon dimple structure on a second surface of the moveable member, opposite the first surface, and forming a polysilicon body between the first and second dimple structures.

2. The method of claim 1, wherein a width of the second dimple structure is substantially the same as a width of the first dimple structure.

3. The method of claim 1 further comprising:
    forming an electrode on the substrate to interact with the moveable member.

4. The method of claim 3, wherein the electrode includes a polysilicon portion and an insulating portion between the polysilicon portion and the substrate.

5. The method of claim 1, wherein the substrate includes bulk silicon, and the insulator includes silicon dioxide.

6. The method of claim 1 further comprising:
    forming a utility bond and a metal layer over the bulk silicon layer,
    forming a cover layer over the metal layer; and
    forming a cavity between the moveable member and the cover layer, wherein the moveable member is enclosed by the cover layer and the substrate.

7. A method for forming a micro-electro-mechanical system (MEMS) device, the method comprising:
    forming a substrate;
    forming an oxide layer over the substrate;
    forming a bulk silicon layer over the oxide layer;

fusion bonding the bulk silicon layer and the oxide layer by annealing;

forming a moveable member from the bulk silicon layer;

forming a first dimple structure on a first surface of the moveable member, the first dimple structure acting as a stopper between the moveable member and the substrate; and forming a signaling component in the oxide layer and the bulk silicon layer, the signaling component comprising polysilicon; and wherein the first dimple structure comprises polysilicon, further wherein forming the first dimple structure includes forming a second polysilicon dimple structure on a second surface of the moveable member, opposite the first surface, and forming a polysilicon body between the first and second dimple structures.

8. The method of claim 7, in which the MEMS device is formed as an accelerometer MEMS device.

9. The method of claim 7, in which the polysilicon body comprises an interposed polysilicon structure in the moveable member, the first dimple structure having a different aspect ratio than the interposed polysilicon structure.

10. A method for forming a micro-electro-mechanical system (MEMS) device, the method comprising:

forming a substrate;

forming an oxide layer over the substrate;

forming a bulk silicon layer over the oxide layer;

forming a moveable member from the bulk silicon layer, the moveable member including an interposed polysilicon body that provides a first polysilicon dimple structure on a first surface of the moveable member, the first dimple structure acting as a stopper between the moveable member and the substrate and a second polysilicon dimple structure on a second surface of the moveable member opposite the first surface; and forming a signaling component in the oxide layer and the bulk silicon layer, the signaling component comprising polysilicon.

11. The method of claim 10, wherein a width of the second dimple structure is substantially the same as a width of the first dimple structure.

12. The method of claim 10 further comprising:

forming an electrode on the substrate to interact with the moveable member.

13. The method of claim 12, wherein the electrode includes a polysilicon portion and an insulating portion between the polysilicon portion and the substrate.

14. The method of claim 10, wherein the substrate includes bulk silicon, and the insulator includes silicon dioxide.

15. The method of claim 10 further comprising:

forming a utility bond and a metal layer over the bulk silicon layer, forming a cover layer over the metal layer to make a cavity between the moveable member and the cover layer, wherein the moveable member is enclosed by the cover layer and the substrate.

\* \* \* \* \*